United States Patent
Hou

(10) Patent No.: US 11,985,877 B2
(45) Date of Patent: May 14, 2024

(54) DISPLAY SUBSTRATE AND METHOD OF MANUFACTURING THE SAME, DISPLAY PANEL, AND DISPLAY DEVICE

(71) Applicant: BOE TECHNOLOGY GROUP CO., LTD., Beijing (CN)

(72) Inventor: Wenjun Hou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 306 days.

(21) Appl. No.: 17/419,108

(22) PCT Filed: Sep. 23, 2020

(86) PCT No.: PCT/CN2020/117030
§ 371 (c)(1),
(2) Date: Jun. 28, 2021

(87) PCT Pub. No.: WO2021/057766
PCT Pub. Date: Apr. 1, 2021

(65) Prior Publication Data
US 2022/0069026 A1 Mar. 3, 2022

(30) Foreign Application Priority Data
Sep. 24, 2019 (CN) .......................... 201910907490.6

(51) Int. Cl.
*H10K 59/35* (2023.01)
*H10K 59/122* (2023.01)
(Continued)

(52) U.S. Cl.
CPC ........... *H10K 59/35* (2023.02); *H10K 59/122* (2023.02); *H10K 59/173* (2023.02);
(Continued)

(58) Field of Classification Search
None
See application file for complete search history.

(56) References Cited

U.S. PATENT DOCUMENTS

| 9,627,458 B2 | 4/2017 | Kim |
| 9,818,966 B2 | 11/2017 | Noh |

(Continued)

FOREIGN PATENT DOCUMENTS

| CN | 103887320 A | 6/2014 |
| CN | 103904228 A | 7/2014 |

(Continued)

OTHER PUBLICATIONS

First Office Action of Priority Application No. CN 201910907490.6 dated Jul. 5, 2021.

(Continued)

*Primary Examiner* — Michelle Mandala
(74) *Attorney, Agent, or Firm* — IP & T GROUP LLP

(57) ABSTRACT

A display substrate having a display area is provided. The display substrate includes a base and a plurality of light-emitting devices disposed on the base and located in the display area. Each light-emitting device includes a light-emitting portion. In at least one light-emitting device, the light-emitting portion is manufactured using an ink-jet printing process. Distances from a plurality of selected points on an edge of an orthographic projection of the light-emitting portion manufactured using the ink-jet printing process on the base to a center of the orthographic projection are equal. Using the center of the orthographic projection as a center of a circle and a distance from a selected point in the plurality of selected points to the center of the orthographic projection as a radius, the plurality of selected points are distributed on the circle at equal intervals.

19 Claims, 8 Drawing Sheets

(51) Int. Cl.
*H10K 59/173* (2023.01)
*H10K 71/00* (2023.01)
*H10K 71/13* (2023.01)

(52) U.S. Cl.
CPC ........... *H10K 59/352* (2023.02); *H10K 71/00* (2023.02); *H10K 71/135* (2023.02)

(56) References Cited

U.S. PATENT DOCUMENTS

| | | |
|---|---|---|
| 2012/0097933 A1 | 4/2012 | Ando |
| 2013/0002690 A1* | 1/2013 | Ichinose ............... H10K 50/858 345/522 |
| 2013/0171756 A1 | 7/2013 | Ando |
| 2014/0175391 A1 | 6/2014 | Song et al. |
| 2014/0342482 A1 | 11/2014 | Morimoto |
| 2016/0181327 A1* | 6/2016 | Im ........................ H10K 59/121 257/40 |
| 2019/0189713 A1 | 6/2019 | Kondo |
| 2019/0189923 A1* | 6/2019 | Cui ........................ H10K 71/15 |
| 2020/0098840 A1 | 3/2020 | Hou |

FOREIGN PATENT DOCUMENTS

| | | |
|---|---|---|
| CN | 104409474 A | 3/2015 |
| CN | 105702707 A | 6/2016 |
| CN | 107204358 A | 9/2017 |
| CN | 108389979 A | 8/2018 |
| CN | 207947279 U | 10/2018 |
| CN | 110148616 A | 8/2019 |
| CN | 110600521 A | 12/2019 |
| JP | 2012-079631 A | 4/2012 |
| KR | 10-2009-0131404 A | 12/2009 |

OTHER PUBLICATIONS

The Second Office Action of Priority Application No. CN 201910907490.6 dated Nov. 18, 2021.

* cited by examiner

DISPLAY SUBSTRATE AND METHOD OF MANUFACTURING THE SAME, DISPLAY PANEL, AND DISPLAY DEVICE

CROSS-REFERENCE TO RELATED APPLICATIONS

This application is a national phase entry under 35 USC 371 of International Patent Application No. PCT/CN 2020/117030 filed on Sep. 23, 2020, which claims priority to Chinese Patent Application No. 201910907490.6, filed on Sep. 24, 2019, which are incorporated herein by reference in their entirety.

TECHNICAL FIELD

The present disclosure relates to the field of display technologies, and in particular, to a display substrate and a method of manufacturing the same, a display panel, and a display device.

BACKGROUND

Compared with a liquid crystal display (LCD) device, an organic light-emitting diode (OLED) display device has the advantages of self-luminescence, fast response, wide viewing angle, high brightness, bright colors, lightness and thinness, which is considered as one of hot spot display products that are pursued and adopted currently.

SUMMARY

In an aspect, a display substrate having a display area is provided. The display substrate includes a base and a plurality of light-emitting devices disposed on the base and located in the display area. Each light-emitting device includes a light-emitting portion. In at least one light-emitting device, the light-emitting portion is manufactured using an ink-jet printing process. Distances from a plurality of selected points on an edge of an orthographic projection of the light-emitting portion manufactured using the ink-jet printing process on the base to a center of the orthographic projection are equal. Using the center of the orthographic projection as a center of a circle and a distance from one of the plurality of selected points to the center of the orthographic projection as a radius, the plurality of selected points are distributed on the circle at equal intervals.

In some embodiments, the plurality of light-emitting devices include a first light-emitting device capable of emitting light of a first color, a second light-emitting device capable of emitting light of a second color, and a third light-emitting device capable of emitting light of a third color. The first, second and third colors are three primary colors. An area of a light exit surface of the first light-emitting device or the second light-emitting device is less than or equal to an area of a light exit surface of the third light-emitting device. An orthographic projection of a light-emitting portion on the base of at least one of the first light-emitting device and the second light-emitting device is in a shape of a circle or a regular polygon with a number of sides greater than or equal to 4. The light-emitting portion whose orthographic projection is in the shape of the circle or the regular polygon is manufactured using the ink-jet printing process.

In some embodiments, the first light-emitting device and the second light-emitting device are located within a range defined by an outer contour of the third light-emitting device. Orthographic projections of the first light-emitting device, the second light-emitting device and the third light-emitting device on the base do not overlap.

In some embodiments, the first light-emitting device includes a first light-emitting portion, the second light-emitting device includes a second light-emitting portion, and the third light-emitting device includes a third light-emitting portion. The display substrate includes a third light-emitting layer covering the display area. A portion of the third light-emitting layer located in a region where the third light-emitting device is located forms the third light-emitting portion. A portion of the third light-emitting layer located in a region where the first light-emitting device is located is disposed on a side of the first light-emitting portion away from the base. A portion of the third light-emitting layer located in a region where the second light-emitting device is located is disposed on a side of the second light-emitting portion away from the base.

In some embodiments, a thickness of the third light-emitting layer is less than thicknesses of the first light-emitting portion and the second light-emitting portion.

In some embodiments, the display substrate further includes at least one first common film layer and at least one second common film layer. The at least one first common film layer includes at least one of a hole injection layer and a hole transport layer. The at least one second common film layer includes at least one of an electron injection layer and an electron transport layer. Each first common film layer and each second common film layer cover the display area. The plurality of light-emitting devices share the at least one first common film layer and the at least one second common film layer.

The at least one first common film layer is located between the third light-emitting layer and the base, and the at least one second common film layer is located on a side of the third light-emitting layer away from the base. In the first light-emitting device, the first light-emitting portion is located between the third light-emitting layer and the at least one first common film layer. In the second light-emitting device, the second light-emitting portion is located between the third light-emitting layer and the at least one first common film layer.

In some embodiments, the display substrate further includes a pixel defining layer, and the pixel defining layer includes a plurality of first pixel defining patterns, a plurality of second pixel defining patterns and a third pixel defining pattern.

Each first pixel defining pattern includes a first opening, and one first light-emitting device is located in one first opening. Each second pixel defining pattern includes a second opening, and one second light-emitting device is located in one second opening. The third pixel defining pattern includes a plurality of third openings, and one first pixel defining pattern and one second pixel defining pattern are disposed in one third opening. One third light-emitting device is located in a region in addition to a region defined by the first pixel defining pattern and the second pixel defining pattern in one third opening.

In some embodiments, an orthographic projection of an outer contour of the third light-emitting device on the base is in a shape of a rectangle or a rectangle with rounded corners.

In some embodiments, in both the first light-emitting device and the second light-emitting device, the orthographic projection of the light-emitting portion on the base is in the shape of the circle or the regular polygon.

In some embodiments, the first color is red, the second color is green, and the third color is blue.

In some embodiments, the area of the light exit surface of the first light-emitting device is less than the area of the light exit surface of the second light-emitting device, and the area of the light exit surface of the second light-emitting device is less than the area of the light exit surface of the third light-emitting device.

In another aspect, a display panel is provided. The display panel includes the display substrate as described in any one of the above.

In yet another aspect, a display device is provided. The display device includes the display panel as described above.

In yet another aspect, a method of manufacturing a display substrate is provided. The display substrate has a display area. The method includes: forming a plurality of light-emitting devices in a region corresponding to the display area on a base, each light-emitting device including a light-emitting portion. In at least one light-emitting device, the light-emitting portion is manufactured using an ink-jet printing process. Distances from a plurality of selected points on an edge of an orthographic projection of the light-emitting portion manufactured using the ink-jet printing process on the base to a center of the orthographic projection are equal. Using the center of the orthographic projection as a center of a circle and a distance from one of the plurality of selected points to the center of the orthographic projection as a radius, the plurality of selected points are distributed on the circle at equal intervals.

In some embodiments, forming the plurality of light-emitting devices, includes: forming first light-emitting devices capable of emitting light of a first color, second light-emitting devices capable of emitting light of a second color, and third light-emitting devices capable of emitting light of a third color, the first, second and third colors being three primary colors. In which, first light-emitting portions of the first light-emitting devices and second light-emitting portions of the second light-emitting devices are formed using the ink-jet printing process, and a third light-emitting layer covering the display area is formed using an evaporation process on the base on which the first light-emitting portions and the second light-emitting portions are formed. Portions of the third light-emitting layer located in regions where the third light-emitting devices are located form third light-emitting portions of the third light-emitting devices.

In some embodiments, forming the plurality of light-emitting devices, further includes: before forming the first light-emitting portions and the second light-emitting portions, forming at least one first common film layer covering the display area on the base using a coating process, the at least one first common film layer including at least one of a hole injection layer and a hole transport layer; and forming at least one second common film layer covering the display area on a side of the third light-emitting layer away from the base using an evaporation process after the third light-emitting layer is formed, the at least one second common film layer including at least one of an electron transport layer and an electron injection layer.

In some embodiments, the manufacturing method further includes: before forming the first light-emitting portions, the second light-emitting portions and the third light-emitting portions, forming a pixel defining layer on the base.

The pixel defining layer includes a plurality of first pixel defining patterns, a plurality of second pixel defining patterns and a third pixel defining pattern. Each first pixel defining pattern includes a first opening, and each first opening is configured to provide one first light-emitting device. Each second pixel defining pattern includes a second opening, and each second opening is configured to provide one second light-emitting device. The third pixel defining pattern includes a plurality of third openings, and one first pixel defining pattern and one second pixel defining pattern are disposed in one third opening. One third light-emitting device is located in a region in addition to a region defined by the first pixel defining pattern and the second pixel defining pattern in one third opening.

BRIEF DESCRIPTION OF THE DRAWINGS

In order to describe technical solutions in the present disclosure more clearly, the accompanying drawings to be used in some embodiments of the present disclosure will be introduced below briefly. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method and an actual timing of a signal involved in the embodiments of the present disclosure.

DETAILED DESCRIPTION

Figure 1:
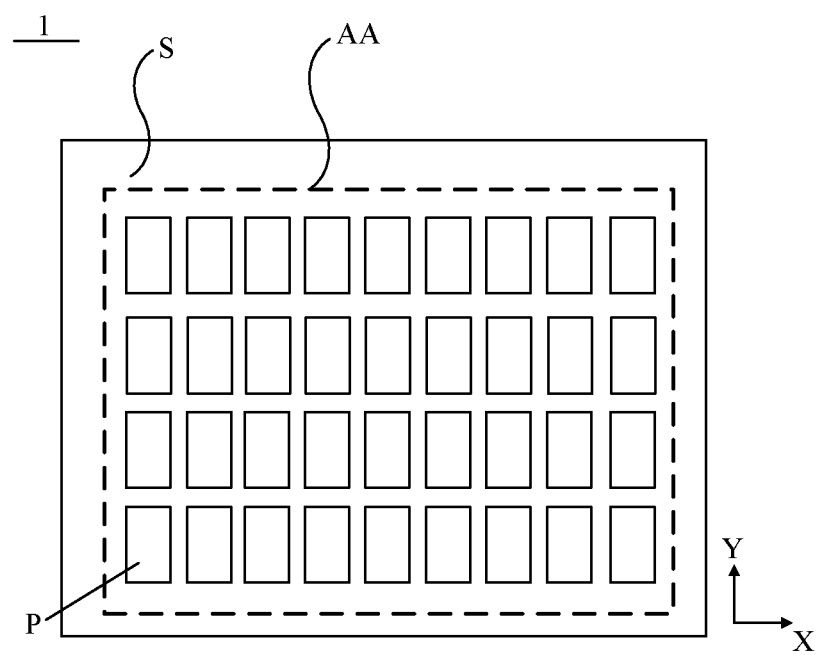
FIG. 1 is a schematic diagram of a display panel, in accordance with some embodiments of the present disclosure.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art on a basis of the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "an example", and "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or examples(s). In addition, the specific features, structures, materials or characteristics may be included in any one or more embodiments or examples in any suitable manner.

Below, the terms such as "first" and "second" are only used for descriptive purposes, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the terms such as "coupled" and "connected" and their extensions may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

As used herein, the term "if" is, optionally, construed to mean "when" or "upon" or "in response to determining" or "in response to detecting", depending on the context. Similarly, the phrase "if it is determined" or "if [a stated condition or event] is detected" is, optionally, construed to mean "upon determining" or "in response to determining" or "upon detecting[the stated condition or event]" or "in response to detecting [the stated condition or event]", depending on the context.

The use of "applicable to" or "configured to" is meant as an open and inclusive expression, which does not exclude devices that are applicable to or configured to perform additional tasks or steps.

The term "about", "approximately", or "substantially" as used herein is inclusive of the stated value and means within an acceptable range of deviation for the particular value as determined by a person of ordinary skill in the art, considering the measurement in question and the errors associated with measurement of the particular quantity (i.e., the limitations of the measurement system).

Exemplary embodiments are described herein with reference to sectional views and/or plan views as idealized exemplary drawings. In the drawings, thicknesses of layers and regions are enlarged for clarity. Therefore, variations in shapes with respect to the drawings due to, for example, manufacturing technologies and/or tolerances are conceivable. Therefore, the exemplary embodiments should not be construed as being limited to the shapes of the regions shown herein, but including the deviations in shapes due to, for example, manufacturing. For example, an etched region that is shown to have a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

In processes of manufacturing an OLED display device, film-formation processes mainly include vacuum evaporation and solution-based processes. The vacuum evaporation is suitable for organic small molecule materials, has a good film-formation uniformity, and is a mature technology. However, the vacuum evaporation has a high equipment cost, a low material utilization rate. Moreover, in a case where the vacuum evaporation is used for producing a display device with a large area of light exit surface, an alignment precision of a mask is low, resulting in a difficult mass production. The solution-based processes include, for example, a spin coating process, an ink-jet printing process, a nozzle coating process, and are suitable for polymer materials and soluble small molecule materials, which have a low production equipment cost. Compared with the vacuum evaporation, the solution-based processes have outstanding advantages in the production of large-scale and large area of light exit surface. However, the solution-based processes are limited by a precision of a film-formation equipment, which results in a low film-formation uniformity. As a result, the resolution of the display device is reduced.

Some embodiments of the present disclosure provide a display device, and the display device includes a display panel 1.

As shown in FIG. 1, the display panel 1 has a display area (also referred to as an active area) AA and a peripheral area S. The peripheral area S is, for example, arranged around the AA.

A plurality of sub-pixels P are provided in the display area AA. The plurality of sub-pixels P include at least sub-pixels of a first color, sub-pixels of a second color and sub-pixels of a third color. The first, second and third colors are three primary colors (e.g., red, green and blue, respectively).

In some embodiments of the present disclosure, the display panel 1 includes a display substrate 2. The display substrate 2 has the display area AA.

Figure 3:
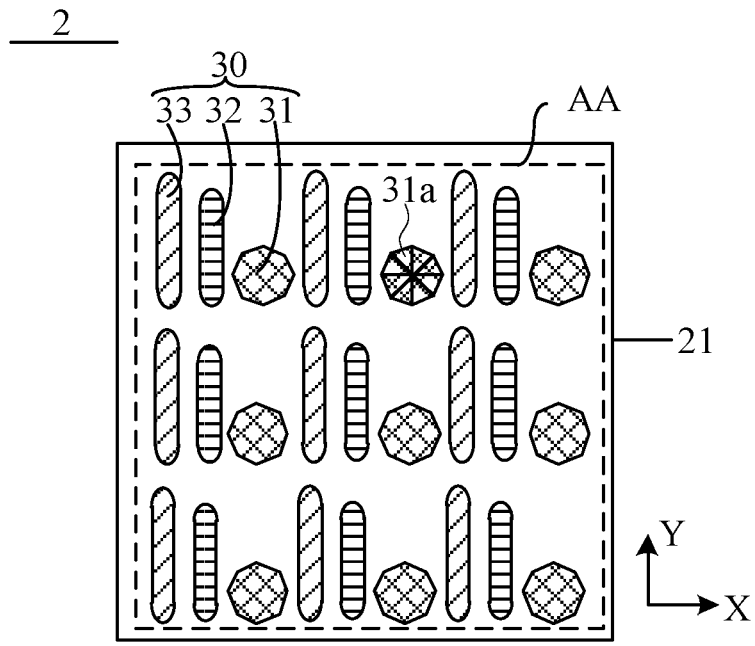
FIG. 3 is a structural diagram of another display substrate, in accordance with some embodiments of the present disclosure.

As shown in FIG. 3, some embodiments of the present disclosure provide the display substrate 2 including a base 21, a plurality of light-emitting devices 30 disposed on the base 21 and located in the display area AA. Each light-emitting device 30 includes a light-emitting portion. For example, each sub-pixel P is provided with one light-emitting device 30.

For example, light emitted from the plurality of light-emitting devices 30 may include red light, green light and blue light, or magenta light, cyan light and yellow light, or white light.

The light-emitting portion(s) of at least one light-emitting device 30 are manufactured using an ink-jet printing process. Distances from a plurality of selected points on an edge of an orthographic projection of the light-emitting portion manufactured using the ink-jet printing process on the base 21 to a center of the orthographic projection are equal. Using the center of the orthographic projection as a center of a circle and the distance from the selected point to the center of the orthographic projection as a radius, the plurality of selected points are distributed on the circle at equal intervals.

It will be noted that, in a case where the distances from the plurality of selected points on the edge of the orthographic projection of the light-emitting portion manufactured using the ink-jet printing process on the base 21 to the center of the orthographic projection are equal, and further in a case where the plurality of selected points are distributed on a circle at equal intervals when using the center of the orthographic projection as a center of the circle and the distance from the selected point to the center of the orthographic projection as a radius, the orthographic projection may be in a shape of a circle, or in a shape of a regular polygon with the number of sides greater than or equal to 4. For example, the orthographic projection is in a shape of a regular octagon or a regular dodecagon.

In a case where the orthographic projection is in the shape of the circle, the plurality of selected points are points distributed on the edge of the circle at equal intervals. In a case where the orthographic projection is the shape of the regular polygon, the plurality of selected points are a plurality of vertices of the regular polygon.

It will be noted that, the orthographic projection of the light-emitting portion of the light-emitting device on the base 21 is substantially in the same shape as an orthographic projection of the light-emitting device 30 on the base 21.

In the plurality of light-emitting devices 30, the light-emitting portion(s) of the at least one light-emitting device 30 are manufactured using the ink-jet printing process. The distances from the plurality of selected points on the edge of the orthographic projection of the light-emitting portion manufactured using the ink-jet printing process on the base 21 to the center of the orthographic projection are equal, and the plurality of selected points are distributed on a circle at equal intervals when using the center of the orthographic projection as a center of the circle and the distance from the selected point to the center of the orthographic projection as a radius; therefore, in a region where the light-emitting device 30 to be formed is located, volatilization environments of a solvent at positions from a center of the region to an edge of the region are substantially the same. In this way, in the process of manufacturing the light-emitting portion using the ink-jet printing process, volatilization amounts at the positions in the region are substantially the same during a movement of a liquid sprayed by a nozzle from the center to the edge of the region where the light-emitting device 30 to be formed is located and during a subsequent film formation, so that the film-formation uniformity is good.

It will be noted that, the volatilization environment of the solvent is related to a distance from the center of the region to the edge of the region. In a case where a flow rate of the liquid is constant, the greater the distance from the center of the region to the edge of the region, the longer duration required for the liquid to flow from the center of the region to the edge of the region, and thus the larger the volatilization amount of the liquid, the thinner the formed film layer.

Figure 4:
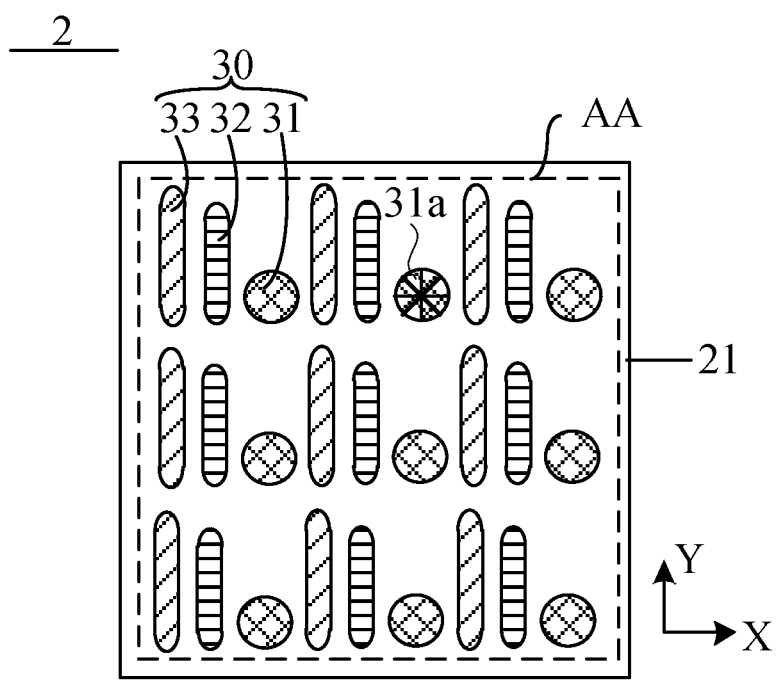
FIG. 4 is a structural diagram of yet another display substrate, in accordance with some embodiments of the present disclosure.

For example, as shown in FIG. 4, in the case where the orthographic projection(s) of the light-emitting portion(s) of the at least one light-emitting device 30 on the base 21 are each in the shape of the circle, for the orthographic projection of the light-emitting portion, a distance from the center of the circle to any point on an edge of the circle is equal to a radius of the circle. In this way, in the process of forming the light-emitting portion using the ink-jet printing process, the durations required for the liquid sprayed by the nozzle to move from the center to positions on the edge of the region where the light-emitting device 30 to be formed is located are equal. Thus, the volatilization amounts of the liquid at the positions in the region where the light-emitting device 30 is located are substantially equal. For example, the volatilization amounts in sub-regions 31a are substantially equal, so that the uniformity of the formed film layer is good.

Or, as shown in FIG. 3, in the case where the orthographic projection(s) of the light-emitting portion(s) of the at least one light-emitting device 30 on the base 21 are each in the shape of the regular polygon (e.g., regular octagon), for the orthographic projection of the light-emitting portion, distances of from the center to the vertices are equal, and a distance from the center to any point on each side is substantially equal to the distance from the center to the vertex. In this way, in the process of forming the light-emitting portion using the ink-jet printing process, the durations required for the liquid sprayed by the nozzle to move from the center to the positions on the edge of the region where the light-emitting device 30 to be formed is located are equal. Thus, the volatilization amounts of the liquid at the positions in the region where the light-emitting device 30 is located are substantially equal. For example, the volatilization amounts in the sub-regions 31a are substantially equal, so that the uniformity of the formed film layer is good.

Figure 8:
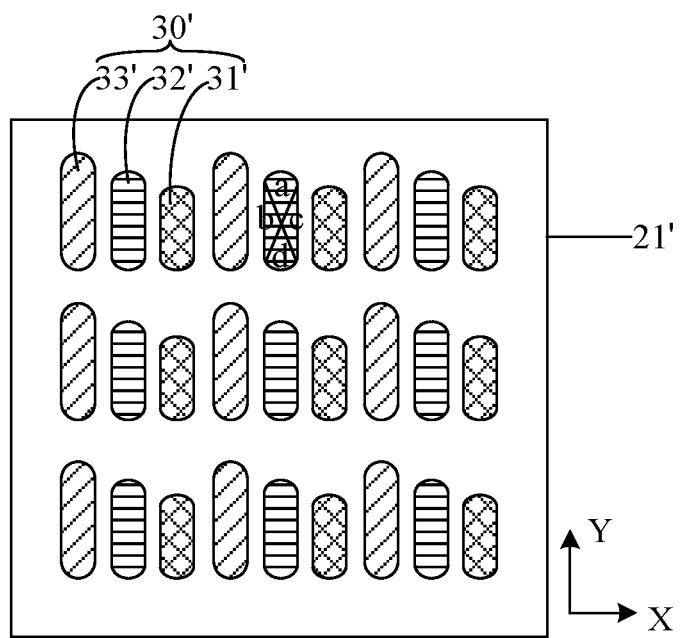
FIG. 8 is a structural diagram of a display substrate in the related art.

As shown in FIG. 8, in a display substrate in the related art, in a case where a large difference in dimensions of an orthographic projection of a light-emitting portion of each light-emitting device 30' on a base 21' in a long axis direction and a short axis direction is present (for example, the orthographic projection of the light-emitting portion of each light-emitting device 30' on the base 21' is in a shape of similar to a rectangle with rounded corners, and an aspect ratio is, for example, greater than 2:1), and in a case where the light-emitting device 30' is manufactured using an ink-jet printing process, during a movement of a liquid from a center to an edge of a region where the light-emitting device 30' to be formed is located, a volatilization environment of a solvent from the center of the region to the edge of the region in the long axis direction is different from a volatilization environment of the solvent from the center of the region to the edge of the region in the short axis direction due to the difference in the dimensions of the orthographic projection of the light-emitting portion of the light-emitting device 30' on the base 21' in the long axis direction and the short axis direction. In this way, in the process of manufacturing the light-emitting portion using the ink-jet printing process, during the movement of the liquid sprayed by a nozzle from the center to the edge of the region where the light-emitting device 30' to be formed is located in the long axis direction and the short axis direction, a volatilization amount of the liquid in a region corresponding to the long axis direction is greater than a volatilization amount of the liquid in a region corresponding to the short axis direction. For example, in FIG. 8, volatilization amounts of the liquid in a sub-region a and a sub-region d are greater than volatilization amounts of the liquid in a sub-region b and a sub-region c. Therefore, thicknesses of portions of a formed film layer located in the sub-region a and the sub-region d are less than thicknesses of portions of the formed film layer located in the sub-region b and the sub-region c, which results in a decreased film-formation uniformity of the light-emitting device 30'.

It is a situation that the difference in the dimensions of the orthographic projection of the light-emitting portion of each light-emitting device 30' on the base 21' in the long axis direction and the short axis direction is present. Instead, in the display substrate 2 provided by some embodiments of the present disclosure, for the at least one light-emitting device 30, the distances from the plurality of selected points on the edge of the orthographic projection of the light-emitting portion on the base 21 to the center of the orthographic projection are equal, and the plurality of selected points are distributed on a circle at equal intervals when using the center of the orthographic projection as a center of the circle and the distance from the selected point to the center of the orthographic projection as a radius. Therefore, in the region where the light-emitting device 30 to be formed is located, the volatilization environments of the solvent at the positions from the center of the region to the edge of the region are substantially the same. In this way, in the process of manufacturing the light-emitting portion using the ink-jet printing process, the volatilization amounts at the positions in the region are substantially equal during the movement of the liquid sprayed by the nozzle from the center to the edge of the region where the light-emitting device 30 to be formed is located and during the subsequent film formation, so that the film-formation uniformity is good, thereby improving the film-formation uniformity of the light-emitting device 30, and improving luminous effects of the light-emitting device.

In some embodiments of the present disclosure, as shown in FIGS. 3 to 7, the plurality of light-emitting devices 30 include first light-emitting devices 31 capable of emitting light of the first color, second light-emitting devices 32 capable of emitting light of the second color and third light-emitting devices 33 capable of emitting light of the third color. That is, the light-emitting devices 30 disposed in the sub-pixels of the first color are the first light-emitting devices 31, the light-emitting devices 30 disposed in the sub-pixels of the second color are the second light-emitting devices 32, and the light-emitting devices 30 disposed in the sub-pixels of the third color are the third light-emitting devices 33.

Areas of light exit surfaces of the first light-emitting device 31 and the second light-emitting device 32 are less than or equal to an area of a light exit surface of the third light-emitting device 33. In at least one of the first light-emitting device 31 and the second light-emitting device 32, the orthographic projection of the light-emitting portion on the base 21 is in the shape of the circle or the regular polygon with the number of sides greater than or equal to 4. The light-emitting portion whose orthographic projection is in the shape of the circle or the regular polygon is manufactured using the ink-jet printing process.

Figure 5:
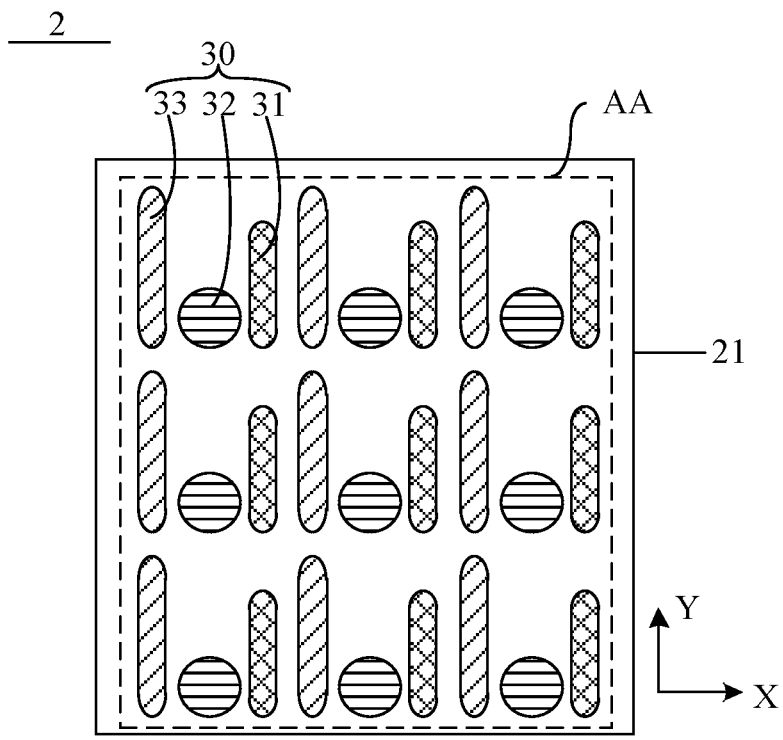
FIG. 5 is a structural diagram of yet another display substrate, in accordance with some embodiments of the present disclosure.

In some examples, in a case where the orthographic projection of the light-emitting portion of one of the first light-emitting device 31 and the second light-emitting device 32 on the base 21 is in the shape of the circle, as shown in FIG. 4, the orthographic projection of the light-emitting portion of the first light-emitting device 31 on the base 21 is in the shape of the circle, or, as shown in FIG. 5, the orthographic projection of the light-emitting portion of the second light-emitting device 32 on the base 21 is in the shape of the circle.

In addition, in a case where the orthographic projection of the light-emitting portion of one of the first light-emitting device 31 and the second light-emitting device 32 on the base 21 is in the shape of the regular polygon with the number of sides greater than or equal to 4, as shown in FIG. 3, the orthographic projection of the light-emitting portion of the first light-emitting device 31 on the base 21 may be in the shape of the regular octagon.

On this basis, in the process of forming the light-emitting portion of the light-emitting device 30 using the ink-jet printing process, for the at least one of the first light-emitting device 31 and the second light-emitting device 32, the distances from the plurality of selected points on the edge of the orthographic projection of the light-emitting portion on the base 21 to the center of the orthographic projection are equal, and the plurality of selected points are distributed on a circle at equal intervals when using the center of the orthographic projection as a center of the circle and the distance from the selected point to the center of the orthographic projection as a radius. Therefore, in the region where the light-emitting device 30 to be formed is located, the volatilization environments of the solvent at the positions from the center of the region to the edge of the region are substantially the same. In this way, during the movement of the liquid sprayed by the nozzle from the center to the edge of the region where the light-emitting device 30 to be formed is located and during the subsequent film-formation, the volatilization amounts at the positions in the region are substantially equal, thereby improving a uniformity of a film thickness of the light-emitting portion of the formed light-emitting device 30.

Figure 6:
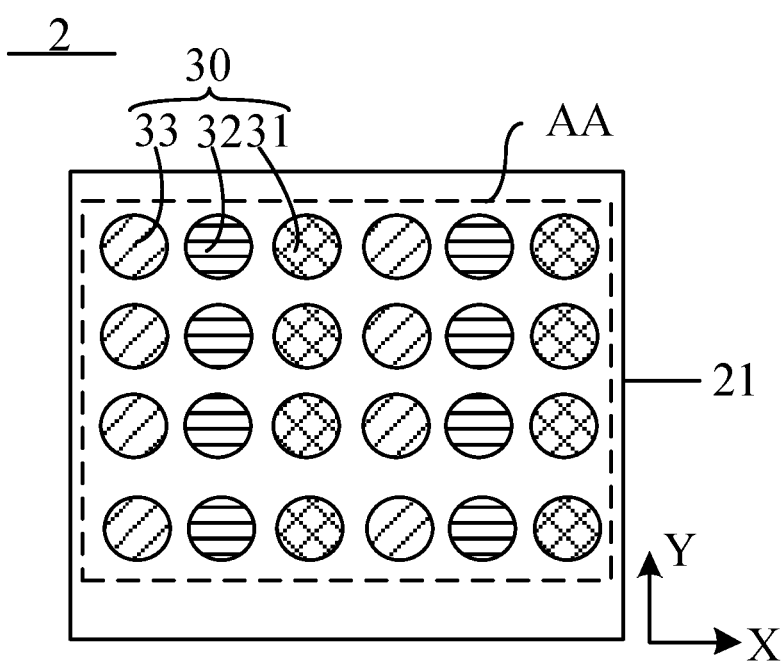
FIG. 6 is a structural diagram of yet another display substrate, in accordance with some embodiments of the present disclosure.
Figure 9:
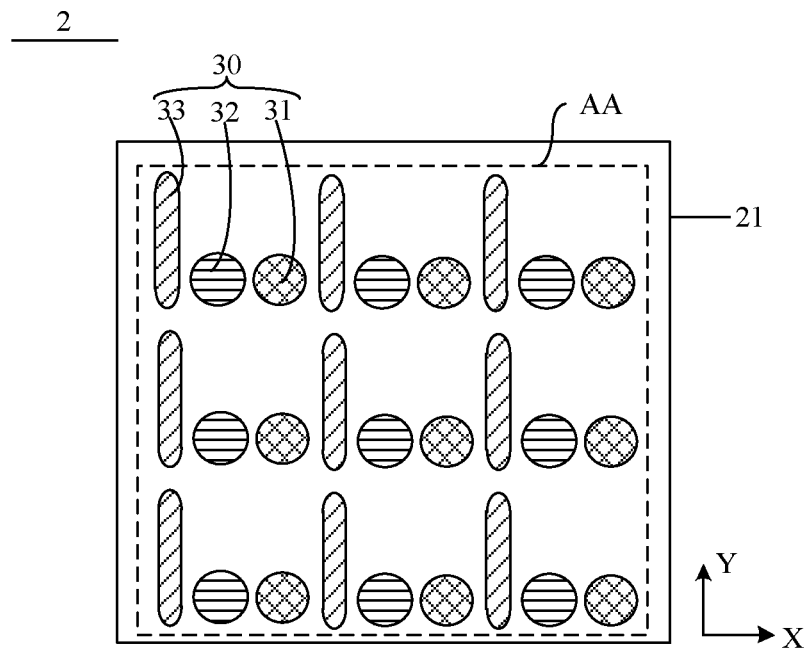
FIG. 9 is a structural diagram of yet another display substrate, in accordance with some embodiments of the present disclosure.

In some other examples, as shown in FIGS. 6 and 9, the orthographic projections of the light-emitting portions of the first light-emitting device 31 and the second light-emitting device 32 on the base 21 are each in the shape of the circle. Or the orthographic projections of the light-emitting portions of the first light-emitting device 31 and the second light-emitting device 32 on the base 21 are each in the shape of the regular polygon with the number of sides greater than or equal to 4.

On this basis, for the first light-emitting device 31 and the second light-emitting device 32, the difference in the distances from the center to the positions on the edge of the orthographic projection of the light-emitting portion is reduced. In terms of process, for example, in a case where the light-emitting portions of the first light-emitting device 31 and the second light-emitting device 32 are manufactured using the ink-jet printing process, in the region where the first light-emitting device 31 or the second light-emitting device 32 to be formed is located, the volatilization environments of the solvent at the positions from the center of the region to the edge of the region are substantially the same. In this way, during the movement of the liquid sprayed by the nozzle from the center to the edge of the region where the light-emitting device 30 to be formed is located and during the subsequent film-formation, the volatilization amounts at the positions in the region are substantially equal, thereby improving the uniformity of the film thickness of the light-emitting portion of the formed first light-emitting device 31 or the second light-emitting device 32.

In some embodiments of the present disclosure, the orthographic projection of the light-emitting portion of the third light-emitting device 33 on the base 21 may also be in the shape of the circle (as shown in FIG. 6) or in a shape of a regular N-polygon.

It will be noted that, in a case where the areas of the light exit surfaces of the first light-emitting device 31 and the second light-emitting device 32 are less than or equal to the area of the light exit surface of the third light-emitting device 33, an area of the orthographic projection of the first light-emitting device 31 on the base 21 and an area of the orthographic projection of the second light-emitting device 32 on the base 21 are less than or equal to an area of the orthographic projection of the third light-emitting device 33 on the base 21.

Figure 7:
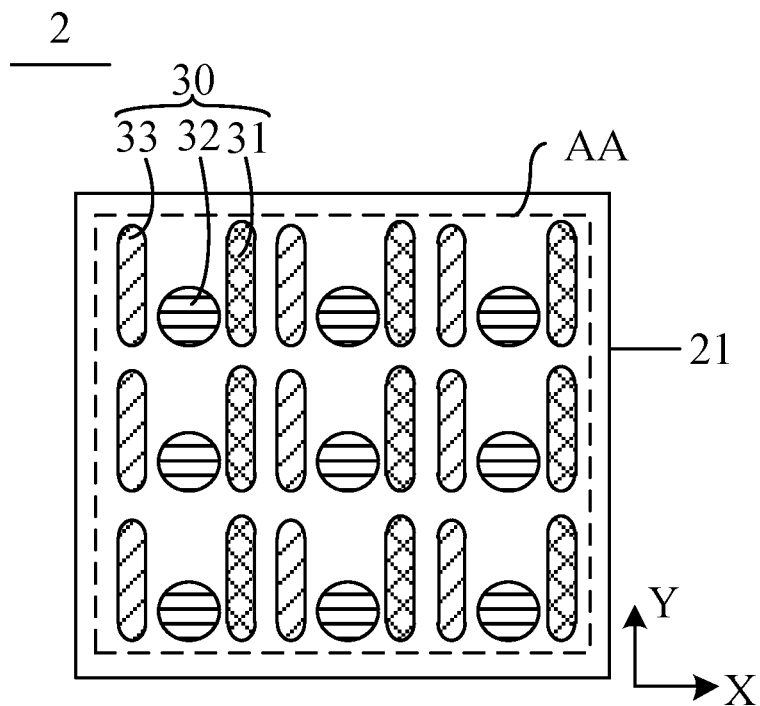
FIG. 7 is a structural diagram of yet another display substrate, in accordance with some embodiments of the present disclosure.

For example, as shown in FIG. 7, the areas of the light exit surfaces of the first light-emitting device 31 and the second light-emitting device 32 are equal to the area of the light exit surface of the third light-emitting device 33. Or, as shown in FIGS. 3 to 5, the areas of the light exit surfaces of the first light-emitting device 31 and the second light-emitting device 32 are less than the area of the light exit surface of the third light-emitting device 33.

Since materials of the light-emitting devices 30 are different, optical properties of the light-emitting devices 30, such as luminous efficiency, light transmittance, or optical lifetime, may be different, so that the luminous effects of the light-emitting devices 30 are also different. For example, in a case where the optical properties of the first light-emitting device 31 and the second light-emitting device 32 are better than the optical property of the third light-emitting device 33, light emissions of the first light-emitting device 31, the second light-emitting device 32 and the third light-emitting device 33 whose light exit surfaces have the same area may be unbalanced. Therefore, by setting the areas of the light exit surfaces of the first light-emitting device 31 and the second light-emitting device 32 to be less than the area of the light exit surface of the third light-emitting device 33, the light emissions of the light-emitting devices 30 may be more balanced, thereby improving the luminous effects.

Figure 2:
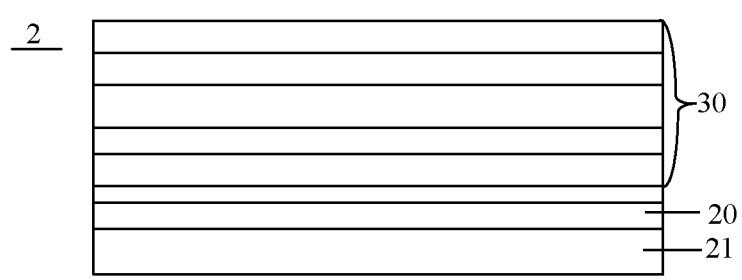
FIG. 2 is a structural diagram of a display substrate, in accordance with some embodiments of the present disclosure.

In some embodiments of the present disclosure, as shown in FIG. 2, the display substrate 2 further includes a plurality of pixel driving circuits 20 located on the base 21. Each pixel driving circuit 20 is located in one sub-pixel. In some embodiments, the pixel driving circuit 20 is composed of electronic devices such as thin film transistors TFTs and a capacitor C. For example, the pixel driving circuit 20 may be a pixel driving circuit 20 of a 2T1C structure composed of two TFTs (a switching TFT and a driving TFT) and the capacitor. Of course, the pixel driving circuit 20 may also be a pixel driving circuit 20 composed of more than two TFTs (a plurality of switching TFTs and the driving TFT) and at least one capacitor.

On this basis, for example, each pixel driving circuit 20 is electrically connected to the light-emitting device 30. The pixel driving circuit 20 is used for driving the light-emitting device 30 to emit light. It will be noted that, FIG. 2 is only a schematic diagram, and does not illustrate specific structures and connection relationships of the pixel driving circuit 20 and the light-emitting device 30 (a suitable pixel driving circuit 20 may be selected according to actual needs).

Figure 10:
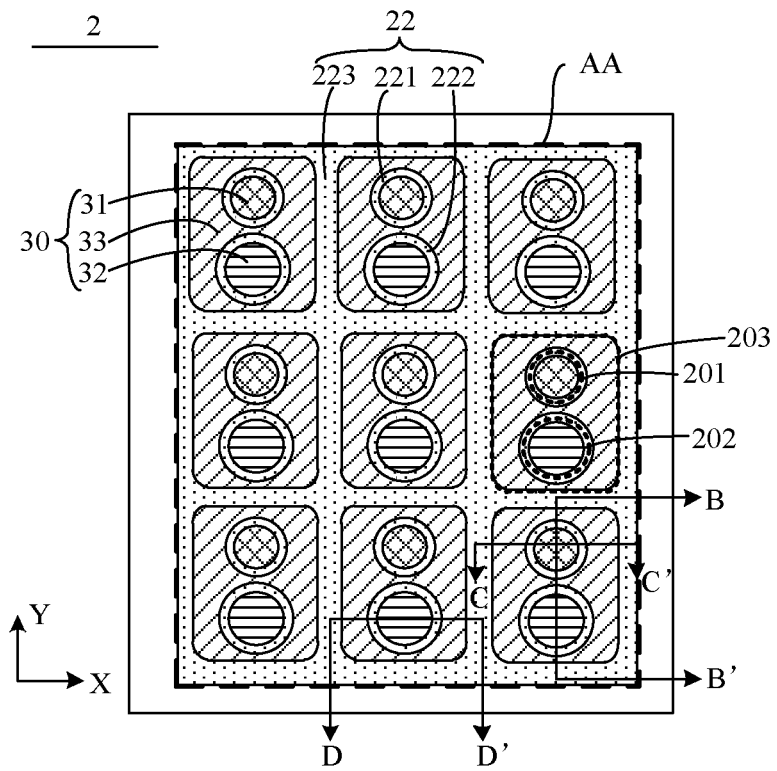
FIG. 10 is a structural diagram of yet another display substrate, in accordance with some embodiments of the present disclosure.

In some embodiments of the present disclosure, as shown in FIG. 10, the first light-emitting device 31 and the second light-emitting device 32 are located within a range defined by an outer contour of the third light-emitting device 33. The orthographic projections of the first light-emitting device 31, the second light-emitting device 32 and the third light-emitting device 33 on the base 21 do not overlap.

It will be understood that in a case where the first light-emitting device 31 and the second light-emitting device 32 are located within the range defined by the outer contour of the third light-emitting device 33, an area of a region defined by the outer contour of the third light-emitting device 33 is greater than a sum of the areas of the light exit surfaces of the first light-emitting device 31 and the second light-emitting device 32.

On this basis, the first light-emitting device 31 and the second light-emitting device 32 are located within the range defined by the outer contour of the third light-emitting device 33, which may reduce a width of the light-emitting devices 30 in a row direction (i.e., the X direction in FIG. 10), so that the number of light-emitting devices in the row direction is increased, and when the display substrate 2 is actually applied to the display panel, the resolution of the display panel may be improved.

In some embodiments of the present disclosure, as shown in FIG. 10, in the case where the first light-emitting device 31 and the second light-emitting device 32 are located within the range defined by the outer contour of the third light-emitting device 33, in addition to regions where the first light-emitting device 31 and the second light-emitting device 32 are located, other region is a region where the third light-emitting device 33 emits light, so that an effective area of a light-emitting region of a pixel is enlarged, and an aperture ratio is increased.

In some embodiments of the present disclosure, the outer contour of the third light-emitting device 33 may be in the shape of the rectangle with rounded corners or in a shape of a regular quadrilateral. As shown in FIG. 10, the outer contour of the third light-emitting device 33 is in the shape of the rectangle with rounded corners.

An orthographic projection of the outer contour of the third light-emitting device 33 on the base 21 is in a shape of a rectangle, or in the shape of the rectangle with rounded corners.

Based this, compared with the first light-emitting device 31 and the second light-emitting device 32 whose orthographic projections on the base 1 are each in the shape of the circle or the regular polygon, in terms of the process, when the third light-emitting device 33 is formed, a structure of the third light-emitting device 33 does not need to be specially designed, which may simplify the production process.

Figure 11:
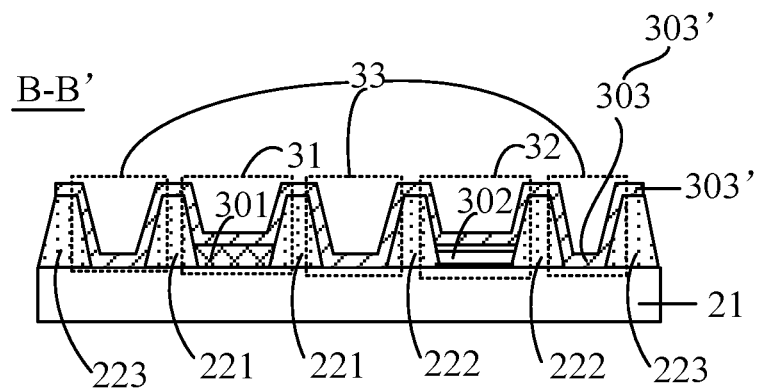
FIG. 11 is a cross-sectional view of the display substrate in FIG. 10 taken along the B-B' direction.
Figure 12:
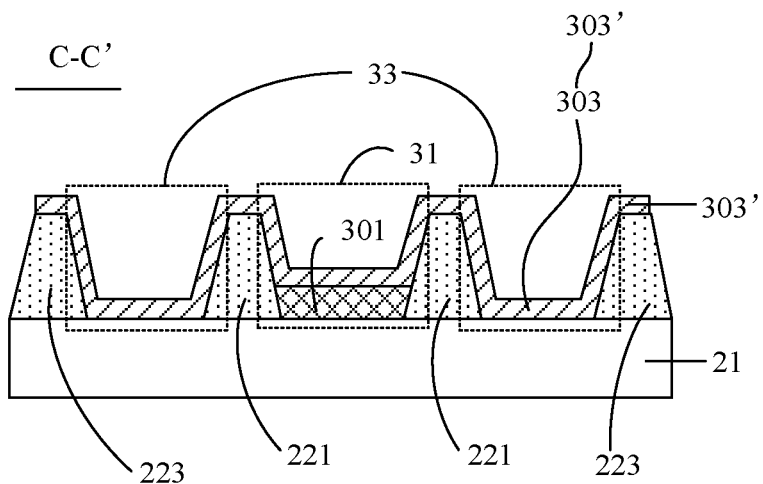
FIG. 12 is a cross-sectional view of the display substrate in FIG. 10 taken along the C-C' direction.
Figure 13:
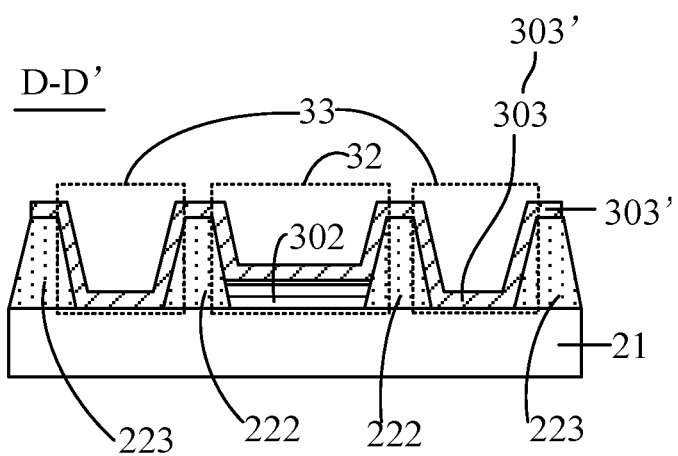
FIG. 13 is a cross-sectional view of the display substrate in FIG. 10 taken along the D-D' direction.

On this basis, in some embodiments of the present disclosure, as shown in FIGS. 11 to 13, the first light-emitting device 31 includes a first light-emitting portion 301, the second light-emitting device 32 includes a second light-emitting portion 302, and the third light-emitting device 33 includes a third light-emitting portion 303.

Referring to FIGS. 11 to 13, the display substrate 2 includes a third light-emitting layer 303', and the third light-emitting layer 303' covers the display area AA. A portion of the third light-emitting layer 303' located in a region where the third light-emitting device 33 is located forms the third light-emitting portion 303.

In the case where the first light-emitting device 31 and the second light-emitting device 32 are located within the range defined by the outer contour of the third light-emitting device 33, a portion of the third light-emitting layer 303' located in the region where the first light-emitting device 31 is located is disposed on a side of the first light-emitting portion 301 away from the base 21, and a portion of the third light-emitting layer 303' located in the region where the second light-emitting device 32 is located is disposed on a side of the second light-emitting portion 302 away from the base 21.

Optionally, the light of the first color emitted from the first light-emitting device is red light, the light of the second color emitted from the second light-emitting device is green light, and the light of the third color emitted from the third light-emitting device is blue light.

In some embodiments, a thickness of the third light-emitting portion 303 is less than thicknesses of the first light-emitting portion 301 and the second light-emitting portion 302. In this way, the first light-emitting device 31 may not be affected by the portion of the third light-emitting layer 303' located in the region where the first light-emitting device 31 is located, and is capable of emitting the light of the first color. The second light-emitting device 32 may not be affected by the portion of the third light-emitting layer 303' located in the region where the second light-emitting device 321 is located, and is capable of emitting the light of the second color. For detailed analysis, please refer to following descriptions.

Since the third light-emitting layer 303' covers the display area AA, in terms of the process, for example, the third light-emitting layer 303' may be formed through an open mask using an evaporation process, so as to simplify the production process.

Figure 14:
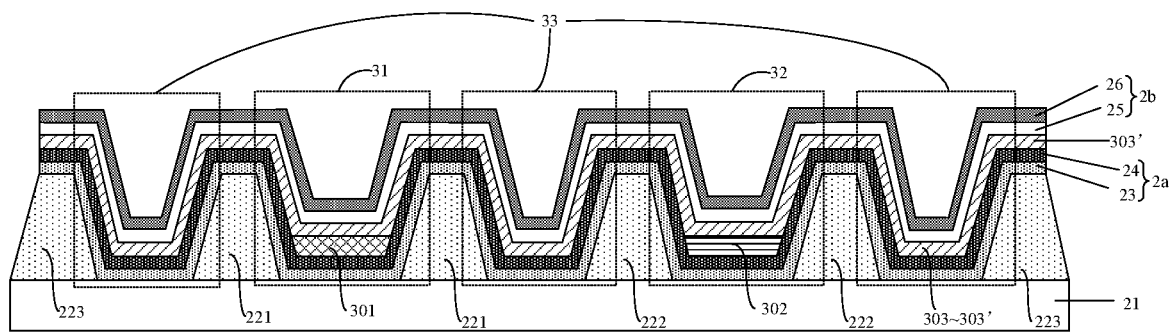
FIG. 14 is a structure diagram of yet another display substrate, in accordance with some embodiments of the present disclosure.

Optionally, as shown in FIG. 14, the display substrate 2 further includes at least one first common film layer 2a and at least one second common film layer 2b.

The at least one first common film layer 2a includes at least one of a hole injection layer 23 and a hole transport layer 24. The at least one second common film layer 2b includes at least one of an electron injection layer 26 and an electron transport layer 25.

Both each first common film layer 2a and each second common film layer 2b cover the display area AA. The light-emitting devices 30 share the at least one first common film layer 2a and the at least one second common film layer 2b.

The at least one first common film layer 2a is located between the third light-emitting layer 303' and the base 21, and the at least one second common film layer 2b is located on a side of the third light-emitting layer 303' away from the base 21.

In the first light-emitting device 31, the first light-emitting portion 301 is located between the third light-emitting layer 303' and the at least one first common film layer 2a. In the second light-emitting device 32, the second light-emitting portion 302 is located between the third light-emitting layer 303' and the at least one first common film layer 2a.

For example, as shown in FIG. 14, the at least one first common film layer 2a includes the hole injection layer 23 and the hole transport layer 24, and the at least one second common film layer 2b includes the electron transport layer 25 and the electron injection layer 26.

In the third light-emitting device 33, the electron injection layer 26 is located on a side of the third light-emitting portion 303 away from the base 21, and the electron transport layer 25 is located between the third light-emitting portion 303 and the electron injection layer 26. The hole transport layer 24 is located on a side of the third light-emitting portion 303 proximate to the base 21, and the hole injection layer 23 is located between the hole transport layer 24 and the base 21.

The hole injection layer 23, the hole transport layer 24, the electron transport layer 25, and the electron injection layer 26 all cover the display area AA.

It will be understood that, in the first light-emitting device 31 and the second light-emitting device 32, the side of the first light-emitting portion 301 away from the base 21 is covered by the third light-emitting layer 303', and the side of the second light-emitting portion 302 away from the base 21 is covered by the third light-emitting layer 303'.

In this case, for example, in the first light-emitting device 31, the hole injection layer 23 is located on a side of the first light-emitting portion 301 proximate to the base 21, and the hole transport layer 24 is located between the first light-emitting portion 301 and the hole injection layer 23. The electron injection layer 26 is located on the side of the third light-emitting layer 303' away from the base 21, and the electron transport layer 25 is located between the third light-emitting layer 303' and the electron injection layer 26.

In this case, electrons from the electron transport layer 25 pass through the third light-emitting layer 303' and reach the first light-emitting portion 301, and are recombined with holes from the hole transport layer 24 in the first light-emitting portion 301, so as to emit the light of the first color. A thickness of the third light-emitting layer 303' is less than the thickness of the first light-emitting portion 301, and in an actual production, the thickness of the third light-emitting layer 303' is thin, so that in the first light-emitting device 31, the electrons and the holes do not recombine in the third light-emitting layer 303'. Therefore, even if the portion of the third light-emitting layer 303' is located in the region where the first light-emitting device 31 is located, the first light-emitting device 31 does not emit the light of the third color, but emits the light of the first color, and the third light-emitting layer 303' may play a role of electron transport in the first light-emitting device 31.

Similarly, in the second light-emitting device 32, the hole injection layer 23 is located on a side of the second light-emitting portion 302 proximate to the base 21, and the hole transport layer 24 is located between the second light-emitting portion 302 and the hole injection layer 23. The electron injection layer 26 is located on the side of the third light-emitting layer 303' away from the base 21, and the electron transport layer 25 is located between the third light-emitting layer 303' and the electron injection layer 26.

In this case, the electrons from the electron transport layer 25 pass through the third light-emitting layer 303' and reach the second light-emitting portion 302, and are recombined with the holes from the hole transport layer 24 in the second light-emitting portion 302, so as to emit the light of the second color. The thickness of the third light-emitting layer 303' is less than the thickness of the second light-emitting portion 302, and in an actual production, the thickness of the third light-emitting layer 303' is thin, so that in the second light-emitting device 32, the electrons and the holes do not recombine in the third light-emitting layer 303'. Therefore, even if the portion of the third light-emitting layer 303' is located in the region where the second light-emitting device 32 is located, the second light-emitting device 32 does not emit the light of the third color, but emits the light of the second color, and the third light-emitting layer 303' may play the role of electron transport in the second light-emitting device 32.

Optionally, as shown in FIG. 10, the area of the light exit surface of the first light-emitting device 31 is less than the area of the light exit surface of the second light-emitting device 32, and the area of the light exit surface of the second light-emitting device 32 is less than the area of the light exit surface of the third light-emitting device 33.

It will be understood that, the area of the orthographic projection of the first light-emitting device 31 on the base 21 is less than the area of the orthographic projection of the second light-emitting device 32 on the base 21, and the area of the orthographic projection of the second light-emitting device 32 on the base 21 is less than the area of the orthographic projection of the third light-emitting device 33 on the base 21.

In a case where the first color is red, the second color is green, and the third color is blue, the first light-emitting device 31 may be referred to as a light-emitting device capable of emitting red light (a red light-emitting device), the second light-emitting device 32 may be referred to as a light-emitting device capable of emitting green light (a green light-emitting device), and the third light-emitting device 33 may be referred to as a light-emitting device capable of emitting blue light (a blue light emitting device). In this case, an area of a light exit surface of the red light-emitting device is less than an area of a light exit surface of the green light-emitting device, and the area of the light exit surface of the green light-emitting device is less than an area of a light exit surface of the blue light-emitting device.

Since an optical property of the red light-emitting device is better than that of the green light-emitting device, and the optical property of the green light-emitting device is better than that of the blue light-emitting device (the optical property of the light-emitting device include, for example, the luminous efficiency, the light transmittance and the optical lifetime), the area of the light exit surface of the red light-emitting device is less than the area of the light exit surface of the green light-emitting device, and the area of the light exit surface of the green light-emitting device is less than the area of the light exit surface of the blue light-emitting device, which may balance the light emissions of the light-emitting devices 30, thereby ensuring the luminous effects of the light-emitting devices 30, and reducing production costs.

In some embodiments of the present disclosure, as shown in FIG. 10, the display substrate 2 further includes a pixel defining layer 22. The pixel defining layer 22 includes a plurality of first pixel defining patterns 221, a plurality of second pixel defining patterns 222 and a third pixel defining pattern 223.

Each first pixel defining pattern 221 includes a first opening 201, and one first light-emitting device 31 is located in one first opening 201.

Each second pixel defining pattern 222 includes a second opening 202, and one second light-emitting device 32 is located in one second opening 202.

The third pixel defining pattern 223 includes a plurality of third openings 203, and one first pixel defining pattern 221 and one second pixel defining pattern 222 are provided in one third opening 203. One third light-emitting device 33 is located in a region in addition to a region defined by the first pixel defining pattern 221 and the second pixel defining pattern 222 in one third opening 203.

It will be understood that, one third light-emitting device 33 is located in one third opening 203, and one first pixel defining pattern 221 and one second pixel defining pattern 222 are provided in one third opening 203. In addition to the region where one first pixel defining pattern 221 and one second pixel defining pattern 222 are provided, remaining region in the third opening 203 is provided with one third light-emitting device 33.

It will be noted that, in terms of process, the plurality of first pixel defining patterns 221, and the plurality of second pixel defining patterns 222 and the third pixel defining pattern 223 are synchronously formed. For example, the plurality of first pixel defining patterns 221, the plurality of second pixel defining patterns 222 and the third pixel defining pattern 223 are arranged in the same layer. The "same layer" means that a film layer for forming a specific pattern is formed by using the same film-formation process, and then is patterned by a single patterning process using the same mask to form a layer structure. Depending on different specific patterns, the single patterning process may include several exposure, development or etching processes, and the specific patterns formed in the layer structure may be continuous or discontinuous, and these specific patterns may also be at different heights or have different thicknesses.

In some embodiments, regions where a plurality of first openings 201 are located correspond to regions of a plurality of sub-pixels of the first color on the base 21 in one-to-one correspondence. Regions where a plurality of second openings 202 are located correspond to regions of a plurality of sub-pixels of the second color on the base 21 in one-to-one correspondence.

Optionally, the pixel defining layer 22 has a lyophobicity. On this basis, in terms of process, in a case where a solution-based process such as an ink-jet printing process is used for manufacturing the light-emitting device 30, the pixel defining layer 22 with the lyophobicity may improve a fluidity of a liquid on the pixel defining layer 22.

It will be understood that, a contact angle between the pixel defining layer 22 and the liquid is greater than 90°. For example, the contact angle between the pixel defining layer 22 and the liquid is greater than 100°.

Some embodiments of the present disclosure further provide a method of manufacturing a display substrate 2. The method includes a following step of S1.

Referring to FIGS. 3 to 5, in S1, a plurality of light-emitting devices 30 are formed in a region of a base 21 corresponding to the display area AA, and each light-emitting device 30 includes a light-emitting portion.

The light-emitting portion(s) of at least one light-emitting device 30 are formed using an ink-jet printing process. Distances from a plurality of selected points on an edge of an orthographic projection of the light-emitting portion manufactured using the ink-jet printing process on the base 21 to a center of the orthographic projection are substantially equal. Using the center of the orthographic projection as a center of circle and the distance from the selected point to the center of the orthographic projection as a radius, the plurality of selected points are distributed on the circle at equal intervals.

It will be noted that, in a case where the distances from the plurality of selected points on the edge of the orthographic projection of the light-emitting portion manufactured using the ink-jet printing process on the base 21 to the center of the orthographic projection are equal, the orthographic projection may be in a shape of a circle, or in a shape of a regular polygon with the number of sides greater than or equal to 4. For example, the orthographic projection is in a shape of a regular octagon or a regular dodecagon.

It will be understood that, in the plurality of light-emitting devices 30, the light-emitting portion(s) of the at least one light-emitting device 30 are manufactured using the ink-jet printing process. The distances from the plurality of selected points on the edge of the orthographic projection of the light-emitting portion manufactured using the ink-jet printing process on the base 21 to the center of the orthographic projection are equal, and the plurality of selected points are distributed on a circle at equal intervals when using the center of the orthographic projection as a center of the circle and the distance from the selected point to the center of the orthographic projection as a radius; therefore, in a region where the light-emitting device 30 to be formed is located, volatilization environments of a solvent at positions from a center of the region to an edge of the region are substantially the same. In this way, in the process of manufacturing the light-emitting portion using the ink-jet printing process, volatilization amounts at the positions in the region are substantially equal during a movement of a liquid sprayed by a nozzle from the center to the edge of the region where the light-emitting device 30 to be formed is located and during a subsequent film formation, so that the film-formation uniformity is good.

For example, as shown in FIG. 4, in a case where the orthographic projection(s) of the light-emitting portion(s) of the at least one light-emitting device 30 on the base 21 are each in the shape of the circle, for the orthographic projection of the light-emitting portion, a distance from the center of the circle to any point on an edge of the circle is equal to a radius of the circle. In this way, in the process of forming the light-emitting portion using the ink-jet printing process, durations required for the liquid sprayed by the nozzle to move from the center to positions on the edge of the region where the light-emitting device 30 to be formed is located are equal. In this way, the volatilization amounts of the liquid at the positions in the region where the light-emitting device 30 is located are substantially equal. For example, the volatilization amounts in sub-regions 31a are substantially equal, so that the uniformity of the formed film layer is good.

In the method of manufacturing the display substrate 2, the light-emitting portion in the at least one light-emitting device 30 is formed using the ink-jet printing process. The distances from the plurality of selected points on the edge of the orthographic projection of the light-emitting portion manufactured using the ink-jet printing process on the base to the center of the orthographic projection are substantially equal, and the plurality of selected points are distributed on a circle at equal intervals when using the center of the orthographic projection as a center of the circle and the distance from the selected point to the center of the orthographic projection as a radius; therefore, the difference in the distances from the center to the positions on the edge of the orthographic projection of the light-emitting portion is small. In the region where the light-emitting device 30 to be formed is located, the volatilization environments of the solvent at the positions from the center of the region to the edge of the region are substantially the same. Therefore, in the process of forming the light-emitting portion using the ink-jet printing process, the volatilization amounts at the positions in the region are substantially equal during the movement of the liquid sprayed by the nozzle from the center to the edge of the region where the light-emitting device 30 to be formed is located and during the subsequent film-formation, so that the film-formation uniformity is good.

Optionally, forming the plurality of light-emitting devices 30 in S1, includes: in S11, forming first light-emitting devices 31 capable of emitting light of a first color, second light-emitting devices 32 capable of emitting light of a second color and third light-emitting devices 33 capable of emitting light of a third color. The first, second, and third colors are three primary colors.

In some embodiments, areas of light exit surfaces of the first light-emitting device 31 and the second light-emitting device 32 are less than or equal to an area of a light exit surface of the third light-emitting device 33. The first light-emitting device 31 and the second light-emitting device 32 are both located within a range defined by an outer contour of the third light-emitting device 33. Orthographic projections of the first light-emitting device 31, the second light-emitting device 32 and the third light-emitting device 33 on the base 21 do not overlap.

Figure 15:
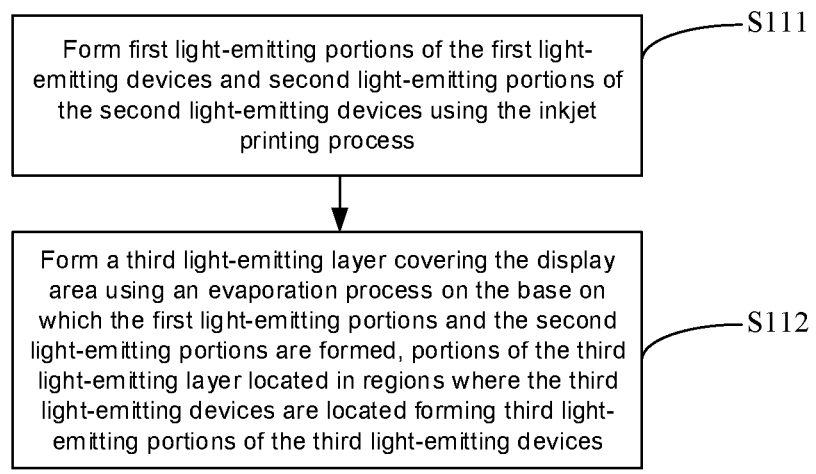
FIG. 15 is a flow diagram of a method of manufacturing a display substrate, in accordance with some embodiments of the present disclosure.

As shown in FIG. 15, forming the first light-emitting devices 31, the second light-emitting devices 32 and the third light-emitting devices 33 in S11, includes S111 and S112.

In S111, referring to FIGS. 11 to 13, by using the ink-jet printing process, first light-emitting portions 301 of the first light-emitting devices 31 are formed in regions where the first light-emitting devices 31 are to be formed, and second light-emitting portions 302 of the second light-emitting devices 32 are formed in regions where the second light-emitting devices 32 are to be formed.

In S112, referring to FIGS. 11 to 13, a third light-emitting layer 303' covering the display area AA is formed on the base 21 on which the first light-emitting portions 301 and the second light-emitting portions 302 are formed using an evaporation process. Portions of the third light-emitting layer 303' located in regions where the third light-emitting devices 33 are located form third light-emitting portions 303.

It will be understood that, orthographic projections of the first light-emitting portion 301 of the first light-emitting device 31 to be formed and the second light-emitting portion 302 of the second light-emitting device 33 to be formed on the base 21 are each in the shape of the circle or the regular polygon with the number of sides greater than or equal to 4. In some embodiments, an orthographic projection of the third light-emitting portion 303 of the third light-emitting device 33 to be formed on the base 21 is also in the shape of the circle or the regular polygon with the number of sides greater than or equal to 4.

On this basis, optionally, the first color is red, the second color is green, and the third color is blue.

In some embodiments of the present disclosure, the third light-emitting portion 303 of the third light-emitting device 33 may also be formed using a coating process or the ink-jet printing process.

It will be noted that, in the practical application, a thickness of the third light-emitting layer 303' is less than thicknesses of the first light-emitting portion 301 and the second light-emitting portion 302.

It will be understood that, the first light-emitting device 31 and the second light-emitting device 32 are located within the range defined by the outer contour of the third light-emitting device 33, which may reduce a width of the light-emitting devices 30 in a row direction (i.e., the X direction in FIG. 10), so that the number of light-emitting devices in the row direction is increased, and when the display substrate 2 is actually applied to the display panel, the resolution of the display panel may be improved.

Moreover, in a case where the first light-emitting device 31 and the second light-emitting device 32 are located within the range defined by the outer contour of the third light-emitting device 33, peripheral regions of the first light-emitting device 31 and the second light-emitting device 32 are utilized by the third light-emitting device 33, thereby enlarging a light-emitting area and increasing an aperture ratio.

Figure 16:
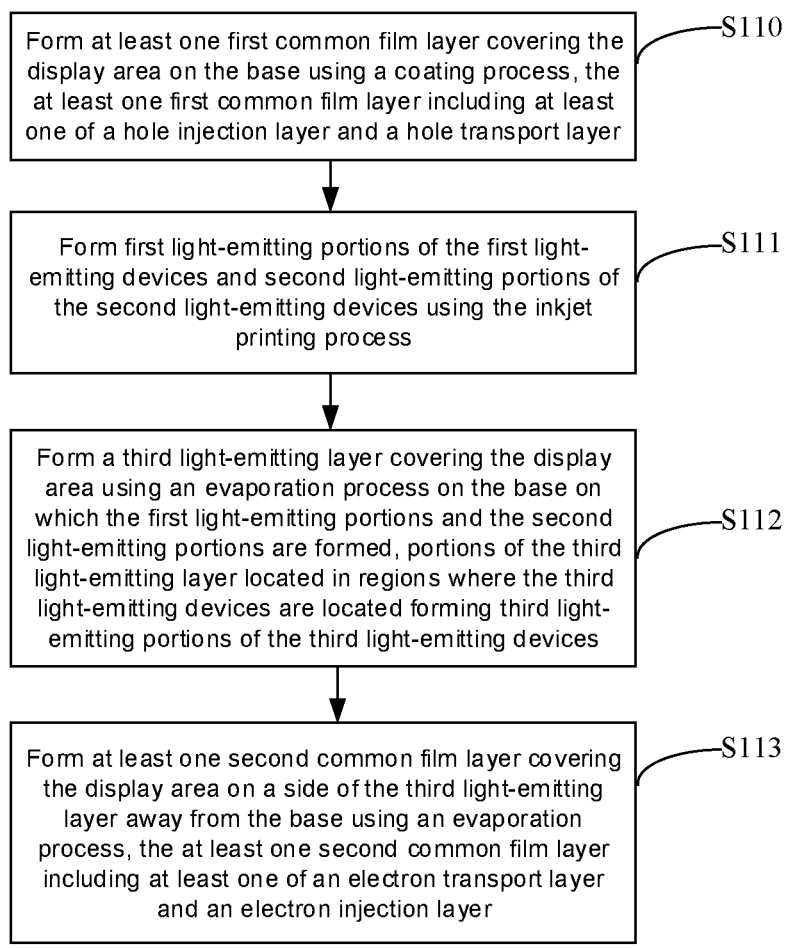
FIG. 16 is another flow diagram of a method of manufacturing a display substrate, in accordance with some embodiments of the present disclosure.

Optionally, as shown in FIG. 16, forming the first light-emitting devices 31, the second light-emitting devices 32 and the third light-emitting devices 33 in S11, further includes S110 and S113.

In S110, referring to FIG. 14, before forming the first light-emitting portions 303 and the second light-emitting portions 302, at least one first common film layer 2a covering the display area AA is formed on the base 21 using a coating process. The at least one first common film layer 2a includes at least one of a hole injection layer 23 and a hole transport layer 24.

For example, both the hole injection layer 23 and the hole transport layer 24 covering the display area AA are sequentially formed on the base 21 using the coating process.

It will be noted that, if an evaporation process is used for forming the hole injection layer 23 and the hole transport layer 24, cross-linking groups used for curing in the hole transport layer 24 are ineffective at a high temperature, which makes a liquid including a material for the first light-emitting portions 301 and a liquid including a material for the second light-emitting portions 302 cannot be cured on a surface of the hole transport layer 24 in a subsequent process of forming the first light-emitting portions 301 of the first light-emitting devices 31 and the second light-emitting portions 302 of the second light-emitting devices 32 using the ink-jet printing process, thereby affecting film-formation effects of the first light-emitting portions 301 and the second light-emitting portions 302. Therefore, in S110, the coating process is used to form the hole injection layer 23 and the hole transport layer 24, which may improve the film-formation effects of the first light-emitting portions 301 and the second light-emitting portions 302.

In S113, referring to FIG. 14, after forming the third light-emitting layer 303', at least one second common film layer 2b covering the display area AA is formed on a side of the third light-emitting layer 303' away from the base 21 using an evaporation process. The at least one second common film layer 2b includes at least one of an electron transport layer 25 and an electron injection layer 26.

For example, both the electron transport layer 25 and the electron injection layer 26 covering the display area AA are sequentially formed on the side of the third light-emitting layer 303' away from the base 21 using the evaporation process.

In some embodiments of the present disclosure, the electron transport layer 25 and the electron injection layer 26 may also be formed through a coating process.

Optionally, the method of manufacturing the display substrate 2, further includes: forming a pixel defining layer 22 on the base 21 before forming the first light-emitting portions 301, the second light-emitting portions 302 and the third light-emitting portions 303.

The pixel defining layer 22 includes a plurality of first pixel defining patterns 221, a plurality of second pixel defining patterns 222 and a third pixel defining pattern 223.

Each first pixel defining pattern 221 includes a first opening 201, and one first light-emitting device 31 is located in one first opening 201.

Each second pixel defining pattern 222 includes a second opening 202, and one second light-emitting device 32 is located in one second opening 202.

The third pixel defining pattern 223 includes a plurality of third openings 203, and one first pixel defining pattern 221 and one second pixel defining pattern 222 are provided in one third opening 203. One third light-emitting device 33 is located in a region in addition to a region defined by the first pixel defining pattern 221 and the second pixel defining pattern 222 in one third opening 203. It will be understood that, one third light-emitting device 33 is located in one third opening 203, and one first pixel defining pattern 221 and one second pixel defining pattern 222 are provided in one third opening 203. In addition to the region where one first pixel defining pattern 221 and one second pixel defining pattern 222 are provided, remaining region in the third opening 203 is provided with one third light-emitting device 33.

Referring to FIG. 10, the third pixel defining pattern 223 including the plurality of third openings 203, and the first pixel defining pattern 221 and the second pixel defining pattern 222 located in each third opening 203 are synchronously formed on the base 21.

It will be noted that, the first pixel defining pattern 221, the second pixel defining pattern 222, and the third pixel defining pattern 223 that are synchronously formed all have the lyophobicity.

The foregoing descriptions are merely specific implementations of the present disclosure, but the protection scope of the present disclosure is not limited thereto. Changes or replacements that any person skilled in the art could conceive of within the technical scope of the present disclosure should be included in the protection scope of the present disclosure. Therefore, the protection scope of the present disclosure shall be subject to the protection scope of the claims.

What is claimed is:

1. A display substrate having a display area, the display substrate comprising:
    a base; and
    a plurality of light-emitting devices disposed on the base and located in the display area, each light-emitting device including a light-emitting portion; wherein
    the light-emitting portion in at least one light-emitting device is a light-emitting portion that is manufactured using an ink-jet printing process, and distances from a plurality of selected points on an edge of an orthographic projection of the light-emitting portion manufactured using the ink-jet printing process on the base to a center of the orthographic projection are equal; and
    the plurality of selected points are distributed on a circle at equal intervals when using the center of the orthographic projection as a center of the circle and a distance from one of the plurality of selected points to the center of the orthographic projection as a radius;
    wherein the plurality of light-emitting devices include a first light-emitting device capable of emitting light of a first color, a second light-emitting device capable of emitting light of a second color, and a third light-emitting device capable of emitting light of a third color; wherein the first, second and third colors are three primary colors;
    an area of a light exit surface of the first light-emitting device or the second light-emitting device is less than or equal to an area of a light exit surface of the third light-emitting device;
    the first light-emitting device and the second light-emitting device are located within a range defined by an outer contour of the third light-emitting device; and orthographic projections of the first light-emitting device, the second light-emitting device and the third light-emitting device on the base do not overlap; and
    an orthographic projection of a light-emitting portion on the base of at least one of the first light-emitting device and the second light-emitting device is in a shape of a circle.

2. The display substrate according to claim 1, wherein the light-emitting portion whose orthographic projection is in the shape of the circle is manufactured using the ink-jet printing process.

3. The display substrate according to claim 1, wherein the first light-emitting device includes a first light-emitting portion, the second light-emitting device includes a second light-emitting portion, and the third light-emitting device includes a third light-emitting portion;

the display substrate includes a third light-emitting layer covering the display area, and a portion of the third light-emitting layer located in a region where the third light-emitting device is located forms the third light-emitting portion;

a portion of the third light-emitting layer located in a region where the first light-emitting device is located is disposed on a side of the first light-emitting portion away from the base; and a portion of the third light-emitting layer located in a region where the second light-emitting device is located is disposed on a side of the second light-emitting portion away from the base.

4. The display substrate according to claim 3, wherein a thickness of the third light-emitting layer is less than thicknesses of the first light-emitting portion and the second light-emitting portion.

5. The display substrate according to claim 3, further comprising at least one first common film layer and at least one second common film layer;

the at least one first common film layer includes at least one of a hole injection layer and a hole transport layer, and the at least one second common film layer includes at least one of an electron injection layer and an electron transport layer;

each first common film layer and each second common film layer cover the display area, and the plurality of light-emitting devices share the at least one first common film layer and the at least one second common film layer;

the at least one first common film layer is located between the third light-emitting layer and the base, and the at least one second common film layer is located on a side of the third light-emitting layer away from the base;

in the first light-emitting device, the first light-emitting portion is located between the third light-emitting layer and the at least one first common film layer; and in the second light-emitting device, the second light-emitting portion is located between the third light-emitting layer and the at least one first common film layer.

6. The display substrate according to claim 1, further comprising a pixel defining layer including a plurality of first pixel defining patterns, a plurality of second pixel defining patterns and a third pixel defining pattern; wherein each first pixel defining pattern includes a first opening, and one first light-emitting device is located in one first opening;

each second pixel defining pattern includes a second opening, and one second light-emitting device is located in one second opening; and the third pixel defining pattern includes a plurality of third openings, and one first pixel defining pattern and one second pixel defining pattern are disposed in one third opening; one third light-emitting device is located in a remaining region in one third opening apart from a region occupied by the first pixel defining pattern and the second pixel defining pattern.

7. The display substrate according to claim 1, wherein an orthographic projection of an outer contour of the third light-emitting device on the base is in a shape of a rectangle or a rectangle with rounded corners.

8. The display substrate according to claim 2, wherein in both the first light-emitting device and the second light-emitting device, the orthographic projection of the light-emitting portion on the base is in the shape of the circle or the regular polygon.

9. The display substrate according to claim 2, wherein the first color is red, the second color is green, and the third color is blue.

10. The display substrate according to claim 9, wherein the area of the light exit surface of the first light-emitting device is less than the area of the light exit surface of the second light-emitting device, and the area of the light exit surface of the second light-emitting device is less than the area of the light exit surface of the third light-emitting device.

11. A display panel, comprising the display substrate according to claim 1.

12. A display device, comprising the display panel according to claim 11.

13. A method of manufacturing a display substrate, the display substrate having a display area; the method comprising:

forming a plurality of light-emitting devices in a region corresponding to the display area on a base, each light-emitting device including a light-emitting portion; wherein in at least one light-emitting device, the light-emitting portion is manufactured using an ink-jet printing process, and distances from a plurality of selected points on an edge of an orthographic projection of the light-emitting portion manufactured using the ink-jet printing process on the base to a center of the orthographic projection are equal; and using the center of the orthographic projection as a center of a circle and a distance from one of the plurality of selected points to the center of the orthographic projection as a radius, the plurality of selected points are distributed on the circle at equal intervals;

wherein forming the plurality of light-emitting devices, includes:

forming first light-emitting devices capable of emitting light of a first color, second light-emitting devices capable of emitting light of a second color, and third light-emitting devices capable of emitting light of a third color, wherein the first, second and third colors are three primary colors; an area of a light exit surface of the first light-emitting device or the second light-emitting device is less than or equal to an area of a light exit surface of the third light-emitting device; the first light-emitting device and the second light-emitting device are located within a range defined by an outer contour of the third light-emitting device; and orthographic projections of the first light-emitting device, the second light-emitting device and the third light-emitting device on the base do not overlap;

wherein first light-emitting portions of the first light-emitting devices and second light-emitting portions of the second light-emitting devices are formed using the ink-jet printing process; an orthographic projection of a light-emitting portion on the base of at least one of the first light-emitting device and the second light-emitting device is in a shape of a circle.

14. The method according to claim 13, wherein forming the plurality of light-emitting devices, further includes:

forming a third light-emitting layer covering the display area using an evaporation process on the base on which the first light-emitting portions and the second light-emitting portions are formed, and portions of the third light-emitting layer located in regions where the third light-emitting devices are located form third light-emitting portions of the third light-emitting devices.

15. The method according to claim 14, wherein forming the plurality of light-emitting devices, further includes:
before forming the first light-emitting portions and the second light-emitting portions, forming at least one first common film layer covering the display area on the base using a coating process, the at least one first common film layer including at least one of a hole injection layer and a hole transport layer; and
forming at least one second common film layer covering the display area on a side of the third light-emitting layer away from the base using an evaporation process after the third light-emitting layer is formed, the at least one second common film layer including at least one of an electron transport layer and an electron injection layer.

16. The method according to claim 14, further comprising:
before forming the first light-emitting portions, the second light-emitting portions and the third light-emitting portions, forming a pixel defining layer on the base; wherein
the pixel defining layer includes a plurality of first pixel defining patterns, a plurality of second pixel defining patterns and a third pixel defining pattern;
each first pixel defining pattern includes a first opening, and each first opening is configured to provide one first light-emitting device;
each second pixel defining pattern includes a second opening, and each second opening is configured to provide one second light-emitting device;
the third pixel defining pattern includes a plurality of third openings, and one first pixel defining pattern and one second pixel defining pattern are disposed in one third opening; one third light-emitting device is located in a region in addition to a region defined by the first pixel defining pattern and the second pixel defining pattern in one third opening.

17. The display substrate according to claim 3, further comprising a pixel defining layer including a plurality of first pixel defining patterns, a plurality of second pixel defining patterns and a third pixel defining pattern; wherein
each first pixel defining pattern includes a first opening, and one first light-emitting device is located in one first opening;
each second pixel defining pattern includes a second opening, and one second light-emitting device is located in one second opening; and
the third pixel defining pattern includes a plurality of third openings, and one first pixel defining pattern and one second pixel defining pattern are disposed in one third opening; one third light-emitting device is located in a region in addition to a region defined by the first pixel defining pattern and the second pixel defining pattern in one third opening.

18. The display substrate according to claim 5, further comprising a pixel defining layer including a plurality of first pixel defining patterns, a plurality of second pixel defining patterns and a third pixel defining pattern; wherein
each first pixel defining pattern includes a first opening, and one first light-emitting device is located in one first opening;
each second pixel defining pattern includes a second opening, and one second light-emitting device is located in one second opening; and
the third pixel defining pattern includes a plurality of third openings, and one first pixel defining pattern and one second pixel defining pattern are disposed in one third opening; one third light-emitting device is located in a region in addition to a region defined by the first pixel defining pattern and the second pixel defining pattern in one third opening.

19. The method according to claim 15, further comprising:
before forming the first light-emitting portions, the second light-emitting portions and the third light-emitting portions, forming a pixel defining layer on the base; wherein
the pixel defining layer includes a plurality of first pixel defining patterns, a plurality of second pixel defining patterns and a third pixel defining pattern;
each first pixel defining pattern includes a first opening, and each first opening is configured to provide one first light-emitting device;
each second pixel defining pattern includes a second opening, and each second opening is configured to provide one second light-emitting device;
the third pixel defining pattern includes a plurality of third openings, and one first pixel defining pattern and one second pixel defining pattern are disposed in one third opening; one third light-emitting device is located in a region in addition to a region defined by the first pixel defining pattern and the second pixel defining pattern in one third opening.

* * * * *